United States Patent
Chen et al.

(10) Patent No.: US 9,484,758 B2
(45) Date of Patent: Nov. 1, 2016

(54) HYBRID BOOTSTRAP CAPACITOR REFRESH TECHNIQUE FOR CHARGER/CONVERTER

(71) Applicant: Apple Inc., Cupertino, CA (US)

(72) Inventors: Bin Chen, Cupertino, CA (US); Mao Ye, San Jose, CA (US); Yongxuan Hu, Cupertino, CA (US)

(73) Assignee: Apple Inc., Cupertino, CA (US)

( * ) Notice: Subject to any disclaimer, the term of this patent is extended or adjusted under 35 U.S.C. 154(b) by 517 days.

(21) Appl. No.: 13/801,817

(22) Filed: Mar. 13, 2013

(65) Prior Publication Data

US 2014/0217959 A1   Aug. 7, 2014

Related U.S. Application Data

(60) Provisional application No. 61/761,156, filed on Feb. 5, 2013.

(51) Int. Cl.
  *H02M 3/04* (2006.01)
  *H02M 3/335* (2006.01)
  *G05F 1/00* (2006.01)
  *H02J 7/00* (2006.01)
  *H02M 3/158* (2006.01)
  *G05F 3/08* (2006.01)
  *H02M 3/28* (2006.01)
  *H02M 1/00* (2006.01)

(52) U.S. Cl.
  CPC .......... *H02J 7/0052* (2013.01); *H02M 3/1582* (2013.01); *H02M 3/1588* (2013.01); *G05F 3/08* (2013.01); *H02J 7/0065* (2013.01); *H02M 3/285* (2013.01); *H02M 2001/0006* (2013.01); *H02M 2001/0032* (2013.01); *H03K 2217/0063* (2013.01); *H03K 2217/0081* (2013.01); *Y02B 40/90* (2013.01); *Y02B 70/1466* (2013.01); *Y02B 70/16* (2013.01); *Y02T 90/127* (2013.01)

(58) Field of Classification Search
  CPC ..................................................... H02J 7/0052
  USPC ......................................... 323/311; 320/107
  See application file for complete search history.

(56) References Cited

U.S. PATENT DOCUMENTS

| | | | |
|---|---|---|---|
| 5,477,131 A * | 12/1995 | Gegner ......................... | 323/222 |
| 5,493,249 A * | 2/1996 | Manning ................... | G05F 3/24 |
| | | | 327/538 |
| 5,959,442 A * | 9/1999 | Hallberg et al. .............. | 323/282 |

(Continued)

*Primary Examiner* — Samuel Berhanu
*Assistant Examiner* — Tarikh Rankine
(74) *Attorney, Agent, or Firm* — Blank Rome LLP

(57) ABSTRACT

The disclosed embodiments provide a synchronous switching converter that converts a DC input voltage into a DC output voltage. This synchronous switching converter includes a high-side switching MOSFET coupled between an input node and a first node. The converter also includes a low-side switching MOSFET coupled between the first node and a ground node and is in series with the high-side switching MOSFET. This converter additionally includes a bootstrap capacitor coupled to the high-side switching MOSFET to provide turn-on voltage for the high-side switching MOSFET. Furthermore, the converter includes a main refresh circuit coupled to the bootstrap capacitor and is configured to refresh the bootstrap capacitor during a first operating mode of the synchronous switching converter. Moreover, the converter includes an auxiliary refresh circuit coupled to the main refresh circuit and the bootstrap capacitor and is configured to refresh the bootstrap capacitor during a second operating mode of the converter.

31 Claims, 6 Drawing Sheets

(56) References Cited

U.S. PATENT DOCUMENTS

| | | | | |
|---|---|---|---|---|
| 6,201,717 B1* | 3/2001 | Grant | ............... | H02M 3/07 363/131 |
| 6,320,796 B1* | 11/2001 | Voo | ............... | G11C 5/145 327/538 |
| 6,812,782 B2* | 11/2004 | Grant | ............... | 327/589 |
| 7,235,955 B2* | 6/2007 | Solie | ............... | H02J 7/022 320/145 |
| 2003/0164728 A1* | 9/2003 | Blodgett | ............... | 327/536 |
| 2004/0145348 A1* | 7/2004 | Bucur et al. | ............... | 320/128 |
| 2004/0207459 A1* | 10/2004 | Farkas | ............... | H02M 3/07 327/536 |
| 2008/0158915 A1* | 7/2008 | Williams | ............... | 363/21.06 |
| 2009/0310414 A1* | 12/2009 | Lee | ............... | G11C 8/12 365/185.17 |
| 2011/0266998 A1* | 11/2011 | Xiao | ............... | 320/107 |
| 2012/0133424 A1* | 5/2012 | Kern | ............... | H02M 3/073 327/536 |
| 2012/0293219 A1* | 11/2012 | Bai et al. | ............... | 327/109 |
| 2012/0299553 A1* | 11/2012 | Menegoli et al. | ............... | 320/140 |
| 2013/0021015 A1* | 1/2013 | Moussaoui et al. | ............... | 323/311 |
| 2014/0203761 A1* | 7/2014 | Paparrizos et al. | ............... | 320/107 |

* cited by examiner

HYBRID BOOTSTRAP CAPACITOR REFRESH TECHNIQUE FOR CHARGER/CONVERTER

RELATED APPLICATION

This application hereby claims priority under 35 U.S.C. §119 to U.S. Provisional Application No. 61/761,156, entitled "HYBRID BOOT-CAP REFRESH TECHNIQUE FOR CHARGING/CONVERTER," by inventors Bin Chen et al. filed on 5 Feb. 2013.

BACKGROUND

1. Field

The disclosed embodiments relate to the design of DC/DC converters. More specifically, the disclosed embodiments relate to designing bootstrap capacitor refresh circuits for synchronous switching DC/DC converters.

2. Related Art

Switched-mode power converters (or "switching converters") are a type of DC/DC power converter which incorporates a switching regulator to convert electrical power from one DC voltage to another DC voltage more efficiently. Switching converters are commonly used in modern computing devices (e.g., both desktop and laptop computers, tablet computers, portable media players, smartphones, and/or other modern computing devices), battery chargers, and electrical vehicles, among other applications. Synchronous switching converters are a particular type of switching converter which utilizes both a high-side MOSFET and a low-side MOSFET to perform a synchronous switching operation.

Switching converters can be classified according to the circuit topology. A buck-type switching converter is a step-down switching converter with an output voltage less than the input voltage level. A boost-type switching converter is a step-up switching converter with an output voltage greater than the input voltage level. A buck-boost switching converter is a DC/DC converter that has an output voltage that can be either greater than or less than the input voltage level. Note that a buck-boost switching converter can be formed by a buck switching converter followed by a boost switching converter. Hence, a buck synchronous switching converter uses both a high-side MOSFET and a low-side MOSFET to perform a synchronous step-down switching operation; a boost synchronous switching converter uses both a high-side MOSFET and a low-side MOSFET to perform a synchronous step-up switching operation; and a 4-switch buck-boost synchronous switching converter can be formed by the two high-side MOSFETs and the two low-side MOSFETs from both the buck and the boost converters.

In practice, each of the buck, boost and buck-boost synchronous switching converters can be controlled by pulse-width modulation (PWM) signals to further improve converter efficiency and to achieve desired output voltage levels. When a synchronous switching converter performs a PWM switching operation, a bootstrap capacitor ($C_{BOOT}$) is often used to provide energy to turn on/off the high-side MOSFET. As the bootstrap capacitor discharges and voltages across the capacitor drop, the bootstrap capacitor has to be refreshed to maintain a sufficient operational voltage. The operation to keep the voltage across the bootstrap capacitor at certain range is referred to as "refresh," and is traditionally achieved by coupling a supply voltage Vs to $C_{BOOT}$ through a diode. More specifically, the energy is delivered from $V_S$ to $C_{BOOT}$ when low-side MOSFET turns on. Limited by total impedance of the refresh loop, this refresh operation demands enough turn-on time of the low-side MOSFET. However, these conventional refresh techniques for $C_{BOOT}$ refresh have a number of drawbacks.

Using the 2-switch buck converter as an example, note that during a discontinuous-current-mode (DCM) PWM switching operation, the turn-on time of the low-side MOSFET is determined by the load conditions. More specifically, when the load is high, the average inductor current $I_L$ is also high and the turn-on time of the low-side MOSFET is longer. However, when the load is light, inductor current $I_L$ drops to near zero, thus the turn-on time is very short, and even zero (some inductor current detection techniques turn off the low-side MOSFET when $I_L$ is near zero). Consequently, there is not enough time to charge up $C_{BOOT}$ to a sufficiently high voltage in light load conditions using the conventional refresh techniques. As mentioned above, to have a successful refresh, the turn-on time of low-side MOSFET needs to be sufficiently long, which means the refresh pulse of low-side MOSFET can be longer than the pulse needed for the DCM operation. This requirement can force the inductor current $I_L$ into negative territory at some light load conditions. However, such a negative current is not desirable for the DCM operation. For example, when the low-side MOSFET is turned off after the refresh cycle, the negative inductor current can flow into the input side of the buck converter through the high-side MOSFET. Effectively, this condition transfers energy from the output back to the input and causes the input voltage to increase (referred to as a "boost-back" condition in a buck converter). This undesired input voltage increase can lead to over-voltage stress. Additionally, when the converter output has an energy-storage component such as a battery, the boost-back condition can also cause unwanted battery discharges current. Similar problem happens when the converter is transitioned into performing pulse-frequency modulation (PFM) switching at a light load condition, wherein the switching frequency is significantly reduced (e.g., down from a few hundred kHz to a few kHz), and the refresh pulse, as well as the negative induct current can happens in the time interval between two PFM pulses.

Another drawback of the conventional refresh techniques is associated with a 4-switch buck-boost converter. In particular, there exists an operation mode where the 4-switch buck-boost converter is under boost-mode operation, wherein the two boost MOSFETs Q3/Q4 are under PWM switching while the two buck MOSFETs Q1/Q2 are not under PWM switching. Instead, the high-side MOSFET Q1 needs to be always ON, while the low-side MOSFET Q2 needs to be always OFF. However, to refresh the bootstrap capacitor requires the high-side MOSFET Q1 to be turned off while the low-side MOSFET Q2 is turned on. Unfortunately, in the case of a 4-switch buck-boost converter, allowing such a refresh operation to occur means that normal operation has to be interrupted. Note that the same problem also occurs when the buck-boost converter is under buck-mode operation.

Hence, what is needed is a synchronous switching DC/DC converter design without the above-described problems.

SUMMARY

The disclosed embodiments provide a synchronous switching converter that converts a DC input voltage into a DC output voltage. This synchronous switching converter includes a high-side switching MOSFET coupled between an input node and a first node. The synchronous switching converter also includes a low-side switching MOSFET coupled between the first node and a ground node and is in series with the high-side switching MOSFET. The synchronous switching converter also includes an inductor coupled to the first node. This converter additionally includes a bootstrap capacitor coupled to the high-side switching MOSFET to provide turn-on voltage for the high-side switching MOSFET. Furthermore, the converter includes a main refresh circuit coupled to the bootstrap capacitor and is configured to refresh the bootstrap capacitor during a first operating mode of the synchronous switching converter. Moreover, the converter includes an auxiliary refresh circuit coupled to the main refresh circuit and the bootstrap capacitor and is configured to refresh the bootstrap capacitor during a second operating mode of the synchronous switching converter.

In some embodiments, the synchronous switching converter is a buck converter.

In some embodiments, the synchronous switching converter is a boost converter.

In some embodiments, the synchronous switching converter is a 4-switch buck-boost converter.

In some embodiments, the auxiliary refresh circuit includes a charge pump circuit which is configured to receive a clock signal as input and generate a sufficiently high output voltage for refreshing the bootstrap capacitor.

In some embodiments, the auxiliary refresh circuit receives a control signal, which is configured to selectively activate or deactivate the auxiliary refresh circuit.

In some embodiments, the control signal is configured to selectively activate or deactivate the auxiliary refresh circuit by selectively passing or blocking the clock signal to the charge pump circuit.

In some embodiments, the synchronous switching converter also includes a controller circuit which is configured to generate the control signal based on the first operating mode and the second operating mode.

In some embodiments, the first operating mode is a continuous current mode (CCM) during a pulse-width modulation (PWM) switching operation.

In some embodiments, the second operating mode is a discontinuous current mode (DCM) during a PWM switching operation.

In some embodiments, the second operating mode is a pulse-frequency modulation (PFM) operation.

In some embodiments, the second operating mode is when the high-side switching MOSFET is ON and the low-side switching MOSFET is OFF.

In some embodiments, the synchronous switching converter further comprises a diode coupled between a supply voltage and the gate of the high-side switching MOSFET.

In some embodiments, the output of the auxiliary refresh circuit is coupled to the main refresh circuit and the bootstrap capacitor at the anode of the diode.

In some embodiments, the output of the auxiliary refresh circuit is coupled to the main refresh circuit and the bootstrap capacitor at the cathode of the diode.

In some embodiments, both the high-side switching MOSFET and the low-side switching MOSFET are N-type MOSFETs.

The disclosed embodiments also provide a charging circuit. This charging circuit includes a DC power connector. The charging circuit also includes a synchronous switching converter coupled to the DC power connector and configured to convert a DC input voltage to a DC output voltage. This synchronous switching converter further includes a high-side switching MOSFET coupled between an input node and a first node. The synchronous switching converter also includes a low-side switching MOSFET coupled between the first node and a ground node and in series with the high-side switching MOSFET. The synchronous switching converter also includes an inductor coupled to the first node. This converter additionally includes a bootstrap capacitor coupled to the high-side switching MOSFET to provide turn-on voltage for the high-side switching MOSFET. Furthermore, the converter includes a main refresh circuit coupled to the bootstrap capacitor and configured to refresh the bootstrap capacitor during a first operating mode of the synchronous switching converter. Moreover, the converter includes an auxiliary refresh circuit coupled to the main refresh circuit and the bootstrap capacitor and configured to refresh the bootstrap capacitor during a second operating mode of the synchronous switching converter.

BRIEF DESCRIPTION OF THE FIGURES

In the figures, like reference numerals refer to the same figure elements.

DETAILED DESCRIPTION

The disclosed embodiments provide synchronous switching DC/DC converter designs which can be used to supply DC power to computing devices (e.g., desktop computers, laptop computers, tablet computers, portable media players, smartphones, and/or other modern computing devices), battery chargers, and electrical vehicles, among other applications.

In particular embodiments, this DC/DC converter includes a high-side switching MOSFET coupled between an input node and a first node. The DC/DC converter also includes a low-side switching MOSFET coupled between the first node and a ground node and in series with the high-side switching MOSFET. This DC/DC converter additionally includes a bootstrap capacitor coupled to the high-side switching MOSFET to provide turn-on voltage for the high-side switching MOSFET. Furthermore, the DC/DC converter includes a main refresh circuit coupled to the bootstrap capacitor and is configured to refresh the bootstrap capacitor during a first operating mode of the synchronous switching converter. The DC/DC converter also includes an auxiliary refresh circuit coupled to the main refresh circuit and the bootstrap capacitor and configured to refresh the bootstrap capacitor during a second operating mode of the synchronous switching converter. Moreover, the DC/DC converter includes a controller which selectively chooses either the main refresh circuit or auxiliary refresh circuit to refresh the bootstrap capacitor.

Figure 1:
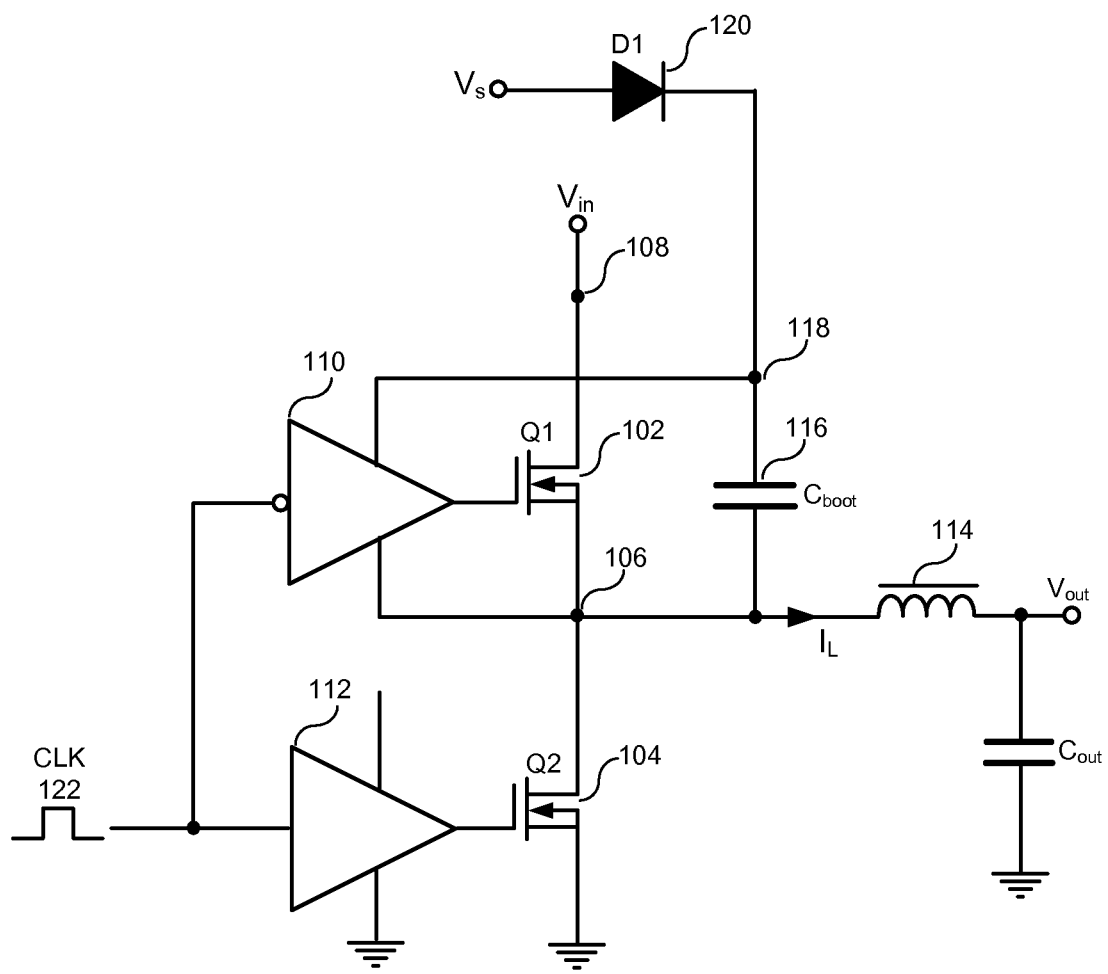
FIG. 1 illustrates a synchronous switched-mode DC/DC buck converter which converts a DC input voltage to a DC output voltage in accordance with some embodiments herein.

FIG. 1 illustrates a synchronous switched-mode DC/DC buck converter 100 which converts a DC input voltage to a DC output voltage in accordance with some embodiments herein. As is illustrated in FIG. 1, synchronous switched-mode DC/DC converter 100 ("converter 100" hereinafter) comprises a high-side N-type MOSFET 102 and a low-side N-type MOSFET 104 which are coupled in series. For the convenience of referencing, we also refer to MOSFET 102 as "Q1," so that MOSFET 102 and Q1 are used interchangeably throughout; and MOSFET 104 as "Q2," so that MOSFET 104 and Q2 are used interchangeably throughout. More specifically, the source/drain path of high-side MOSFET 102 is coupled between a switch node 106, and an input node 108 which receives an input voltage $V_{in}$. The source/drain path of low-side MOSFET 104 is coupled between the ground and switch node 106. The gate of high-side MOSFET 102 is coupled to the output of a driver circuit 110, while the gate of low-side MOSFET 104 is coupled to the output of a driver circuit 112. Converter 100 also includes a switching inductor 114 which is coupled between switch node 106 and the output port $V_{out}$.

Converter 100 additionally includes a bootstrap capacitor 116 (also referred to as "$C_{BOOT}$") which is used to provide energy to turn on/off MOSFET 102. More specifically, bootstrap capacitor 116 is coupled between a boot node 118 and switch node 106 (i.e., the source of Q1), wherein boot node 118 of bootstrap capacitor 116 is used to bias driver circuit 110. As can be seen in FIG. 1, when driver circuit 110 is properly biased, a logic LOW input to driver circuit 110 will generate a logic HIGH output which drives the gate of MOSFET 102 to turn on MOSFET 102. Note that while powering driver circuit 110, bootstrap capacitor 116 discharges and voltage across capacitor 116 drops. Hence, bootstrap capacitor 116 has to be refreshed to maintain a sufficient operational voltage. This is achieved by coupling a supply voltage Vs to boot node 118 through a diode 120 (also referred to as "D1").

Conventionally, when switching converter 100 is performing normal PWM switching, high-side MOSFET 102 and low-side MOSFET 104 are switched on and off alternately in a synchronous manner controlled by a PWM clock signal 122 (or "clk 122") and driver circuits 110 and 112. During this operation, converter 100 allows capacitor 116 to refresh in the following manner. When high-side MOSFET 102 is turned off and low-side MOSFET 104 is turned on, supply voltage Vs charges bootstrap capacitor 116 via diode 120 to keep the voltage across capacitor 116 at a certain range. In particular, the circuit of FIG. 1 is capable of charging boot node 118 toward $Vs-V_{D1}$ when Q2 is ON, wherein $V_{D1}$ is the turn-on voltage of diode 120. Next, when low-side MOSFET 104 is turned off, voltage of boot node 118 will be $V_{PH}+Vs-V_{D1}$, wherein $V_{PH}$ is the voltage of switch node 106, and energy stored in bootstrap capacitor 116 will allow high-side MOSFET 102 to be turned on. As mentioned about, this refreshing scheme has a number of drawbacks. In particular, when converter 100 is under DCM or PFM switching, it is extremely difficult to maintain an adequate charging time for bootstrap capacitor 116 without drawing negative current $I_L$.

Note that when converter 100 is part of a 4-switch buck-boost converter, and converter 100 is not under normal PWM switching, low-side MOSFET 104 is typically turned off while high-side MOSFET 102 remains turned on due to the power supplied by bootstrap capacitor 116. However, to refresh bootstrap capacitor 116 requires that high-side MOSFET 102 is turned off while low-side MOSFET 104 is turned on. Unfortunately, in the case of a 4-switch buck-boost converter, allowing such a refresh operation to occur means that normal converter operation has to be interrupted.

Figure 2:
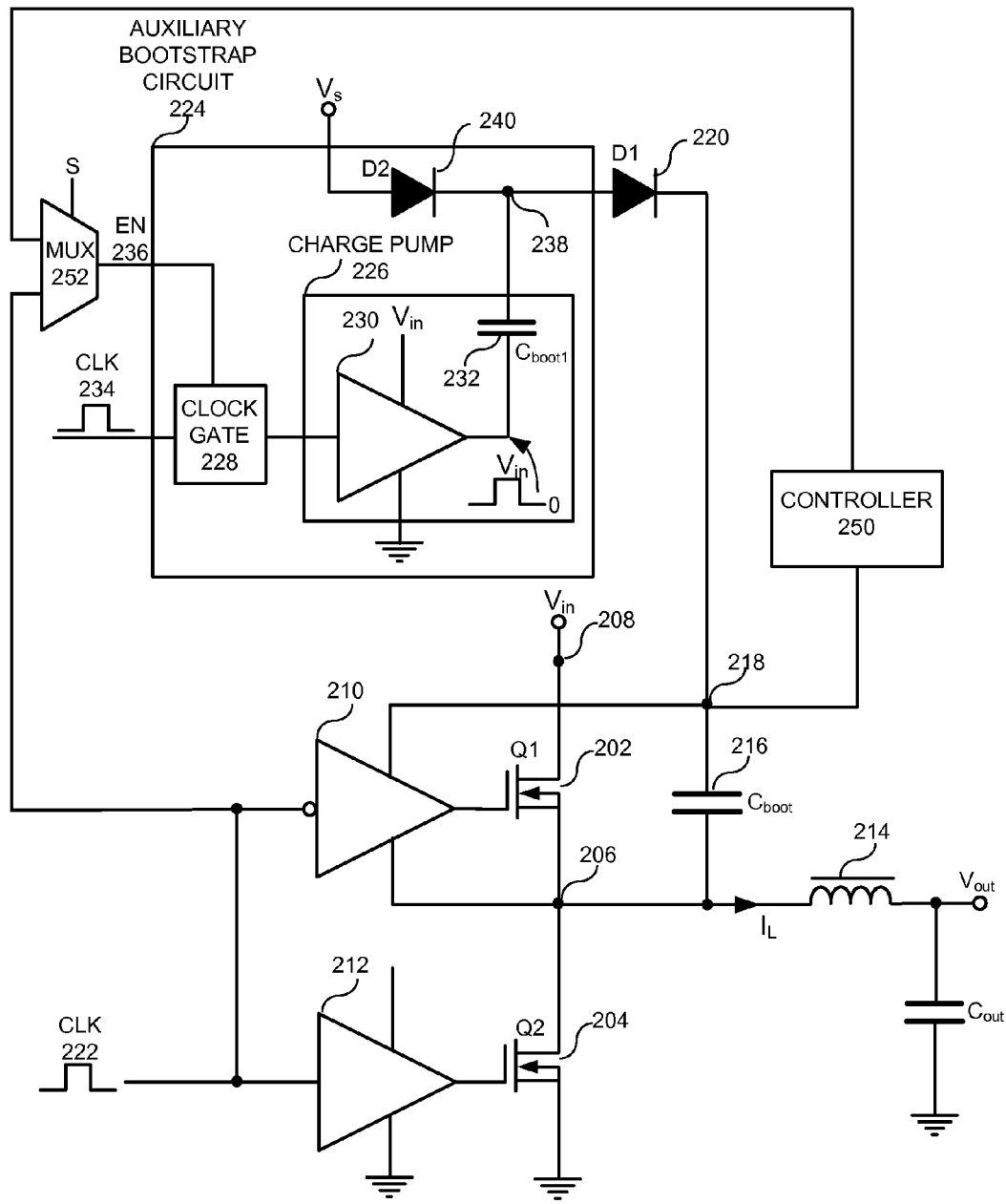
FIG. 2 illustrates a synchronous switched-mode DC/DC buck converter which includes an auxiliary bootstrap mechanism in accordance with some embodiments herein.

FIG. 2 illustrates a synchronous switched-mode DC/DC buck converter 200 which includes an auxiliary bootstrap mechanism in accordance with some embodiments herein. As is illustrated in FIG. 2, synchronous switched-mode DC/DC converter 200 ("converter 200" hereinafter) comprises all or substantially all components of converter 100. This includes a high-side N-type MOSFET 202 (also referred to as "Q1"), a low-side N-type MOSFET 204 (also referred to as "Q2"), driver circuits 210 and 212, a switching inductor 214, a bootstrap capacitor 216 (also referred to as "$C_{BOOT}$"), and a diode 220 (also referred to as "D1"). Note that diode 220 and bootstrap capacitor 216 form the conventional bootstrap circuit for $C_{BOOT}$ refresh. Note also that nodes within converter 200 in FIG. 2 and equivalent nodes within converter 100 in FIG. 1 have like reference numerals. For example, switch node 206 in FIG. 2 is equivalent to switch node 106 in FIG. 1. Note that converter 200 receives an input voltage $V_{in}$ at the input node 208.

Converter 200 also includes an auxiliary bootstrap circuit 224, which further comprises a charge pump 226 and a clock gate 228. In the embodiment shown, charge pump 226 further comprises a driver circuit 230 and an auxiliary bootstrap capacitor 232 (also referred to as "$C_{BOOT1}$"), which are coupled in series at the output of driver circuit 230. Driver circuit 230 receives a supply power which is the same as input voltage $V_{in}$ of converter 200. Note that charge pump 226 may be implemented using other known charging pump configurations different from the specific embodiment shown in FIG. 2.

Clock gate 228 of auxiliary bootstrap circuit 224 receives a clock signal 234 (or "clk 234") as input. Clock gate 228 also receives an enable signal 236 (or "EN 236"), which is configured to selectively enable/disable clock gate 228, i.e., passing or blocking clock signal 234. Enable signal 236 may be generated by a controller circuit, which is described in more detail below. In the embodiment shown, the output of clock gate 228 is coupled to an input of driver circuit 230, which receives clk 234 only when clock gate 228 is enabled by enable signal 236. Hence, auxiliary bootstrap circuit 224 is considered "enabled" when charge pump 226 receives clk 234. Capacitor 232 is coupled between the output of driver circuit 230 and input node 238 of diode 220. Note that auxiliary bootstrap circuit 224 includes a diode 240 (also referred to as "D2") which is coupled between supply voltage Vs and node 238. We now describe how bootstrap capacitor 216 is refreshed within converter 200.

Note that when converter 200 is performing normal PWM switching, high-side MOSFET 202 and low-side MOSFET 204 are switched on and off alternately in a synchronous operation controlled by a PWM clock signal 222 (or "clk 222") and driver circuits 210 and 212. As mentioned previously, during PWM switching, converter 200 can operate in one of the following operation modes: continuous current mode (CCM), discontinuous current mode (DCM), and pulse-frequency modulation (PFM). In one embodiment, converter 200 uses a controller 250 to determine which operation mode converter 200 is in. If converter 200 is under CCM switching, controller 250 allows bootstrap capacitor 216 to be refreshed in the same manner as described above in conjunction with converter 100, i.e., letting Vs charge capacitor 216 during the time intervals when Q2 is turned on and Q1 is turned off.

Furthermore, when converter 200 is under CCM switching, $C_{BOOT}$ will be refreshed every switching cycle and controller 250 deactivates auxiliary bootstrap circuit 224 so that no current flows in and out of auxiliary bootstrap capacitor 232. For example, controller 250 can disable clk 234 at the clock gate 228 by setting enable signal 236 to a "DISABLE" logic value. Note that because charge pump 226 does not receive clock signals, no power loss is incurred by this circuit during the CCM switching operation. However, if converter 200 is under either DCM switching or PFM switching, and if the $C_{BOOT}$ voltage falls below certain threshold due to insufficient refresh, controller 250 enables clk 234 at the clock gate 228 by setting enable signal 236 to an "ENABLE" logic value. Thus, clk 234 activates auxiliary bootstrap circuit 224 which is subsequently used to refresh bootstrap capacitor 216.

In the embodiment of convert 200, clk 222 is also coupled to clock gate 228, and can be optionally used as enable signal 236 to turn on/off clock gate 228. More specifically, when clk 222 is HIGH, low-side MOSFET 204 is turned on to allow bootstrap capacitor 216 to refresh. Consequently, clk 222 can be used to disable clock gate 228, so that auxiliary bootstrap circuit 224 is deactivated. On the other hand, when clk 222 is LOW, low-side MOSFET 204 is turned off. Consequently, clk 222 can be used to enable clock gate 228, so that auxiliary bootstrap circuit 224 is activated. In the embodiment shown, clk 222 and the control output of controller 250 are coupled to clock gate 228 through a 2:1 multiplexor (MUX) 252, which is configured to select one of the two control signals as enable signal 236 based on predetermined logic.

As mentioned above, when converter 200 is part of a 4-switch buck-boost converter, and converter 200 is not performing PWM switching, low-side MOSFET 204 is typically turned off while high-side MOSFET 202 remains turned on due to the power supplied by bootstrap capacitor 216. In some embodiments, auxiliary bootstrap circuit 224 is also activated and used to refresh bootstrap capacitor 216. We now describe how auxiliary bootstrap circuit 224 operates to keep bootstrap capacitor 216 refreshed when auxiliary bootstrap circuit 224 is activated. Note that the following discussion applies to all of the following scenarios: (1) converter 200 is under DCM switching, (2) converter 200 is under PFM switching, and (3) converter 200 is not under PWM switching with Q1 ON and Q2 OFF.

As can be seen in FIG. 2, when auxiliary bootstrap circuit 224 is activated, clock gate 228 is open to allow clk 234 to be coupled to driver circuit 230 within charge pump 226. Driver circuit 230 additionally receives a bias voltage $V_{in}$, which is the input voltage to converter 200. Assuming $V_{in}$ is a normal positive input voltage, when clk 234 is logic LOW, the output of driver circuit 230 is near zero volts. Therefore, supply voltage Vs charges auxiliary bootstrap capacitor 232 through diode 240 to cause voltage at node 238 to rise toward $Vs-V_{D2}$, wherein $V_{D2}$ is the turn-on voltage of diode 240. Next, when clk 234 transitions to logic HIGH, the output of driver circuit 230 transitions from zero volts to supply voltage $V_{in}$. The charge pump effect forces voltage at node 238 to jump to $V_{in}+Vs-V_{D2}$. Note that, depending on the operating mode, $V_{PH}$ at switch node 206 is generally between zero volts and input voltage $V_{in}$. Hence, as long as voltage at node 218 is greater than $V_{PH}$, energy stored in auxiliary bootstrap capacitor 232 will be transferred to bootstrap capacitor 216 by charging up node 218. More specifically, when voltage at node 238 is $V_{in}+Vs-V_{D2}$, as long as $(V_{in}+Vs-V_{D1}-V_{D2})>V_{PH}$, bootstrap capacitor 216 is charged up toward $V_{in}+Vs-V_{D1}-V_{D2}$, and bootstrap capacitor 216 is being refreshed.

Note that the process of charging up bootstrap capacitor 216 to a desired level can take multiple clock cycles of clk 234. In each clock cycle, when clk 234 is LOW, Vs charges capacitor 232 to store a small amount of energy in capacitor 232. In the same clock cycle, when clk 234 is HIGH, the small amount of energy is transferred from capacitor 232 to bootstrap capacitor 216. Note that when clk 234 frequency is high, it may take more clock cycles to refresh bootstrap capacitor 216, but auxiliary bootstrap capacitor 232 can be very small. A small capacitor 232 may be advantageous for integrating capacitor 232 into the IC. Moreover, high clk 234 frequency also facilitates reducing ripple in the output voltage of the converter. Typically, auxiliary bootstrap capacitor 232 has a capacitance $C_{BOOT1} \ll C_{BOOT}$. In some embodiments, capacitor 232 can be implemented using a parasitic capacitance of converter 200.

Typically, bootstrap capacitor 216 is refreshed only when refresh is needed, for example when the voltage across bootstrap capacitor 216 drops below a certain threshold value. In one embodiment, controller 250 additionally monitors the voltage across bootstrap capacitor 216. If this voltage is greater than a predetermined threshold voltage, controller 250 determines that no refresh is needed at the moment, and keeps auxiliary bootstrap circuit 224 deactivated. When controller 250 detects that the bootstrap capacitor voltage is less than the predetermined threshold voltage, controller 250 determines that refresh is needed, and subsequently activates auxiliary bootstrap circuit 224. In one embodiment, the predetermined threshold voltage is set to be at least greater than the threshold voltage $V_{gs\_th}$ of n-channel MOSFET 202. For example, in the case when switch node 206 is at $V_{in}$, voltage $V_{bt}$ at node 218 should be maintained such that $V_{bt}-V_{in}>V_{gs\_th}$. In some embodiments, the threshold value is chosen to keep sufficient headroom so that bootstrap capacitor 216 retains sufficient charge to keep MOSFET 202 turned on while the capacitor is being refreshed, i.e., $V_{bt}-V_{in} \geq V_{gs\_th}+\Delta V$. Moreover, because auxiliary bootstrap circuit 224 is capable of charging $V_{bt}$ up to $V_{in}+Vs-V_{D1}-V_{D2}$, supply voltage Vs may be chosen so that $Vs-V_{D1}-V_{D2} \geq V_{gs\_th}+\Delta V$.

In the above-described refresh process using auxiliary bootstrap circuit 224, refreshing bootstrap capacitor 216 does not need to switch high-side MOSFET 202 and low-side MOSFET 204 when high-side MOSFET 202 needs to be in an ON state while low-side MOSFET 204 is in an OFF state. This is particularly beneficial when converter 200 is used within a 4-switch buck-boost converter and converter 200 is not under PWM switching. Note also that the refresh process is substantially independent from the operating mode of converter 200. More specifically, the above-described refresh process can be carried out as long as auxiliary bootstrap circuit 224 is activated, regardless of whether converter 200 is under DCM switching, PFM switching, or not under regular PWM switching. Furthermore, using auxiliary bootstrap circuit 224 for refresh operation under light load conditions (such as DCM switching) prevents negative $I_L$ that is typically associated with conventional bootstrap capacitor refresh under the same conditions.

Figure 3:
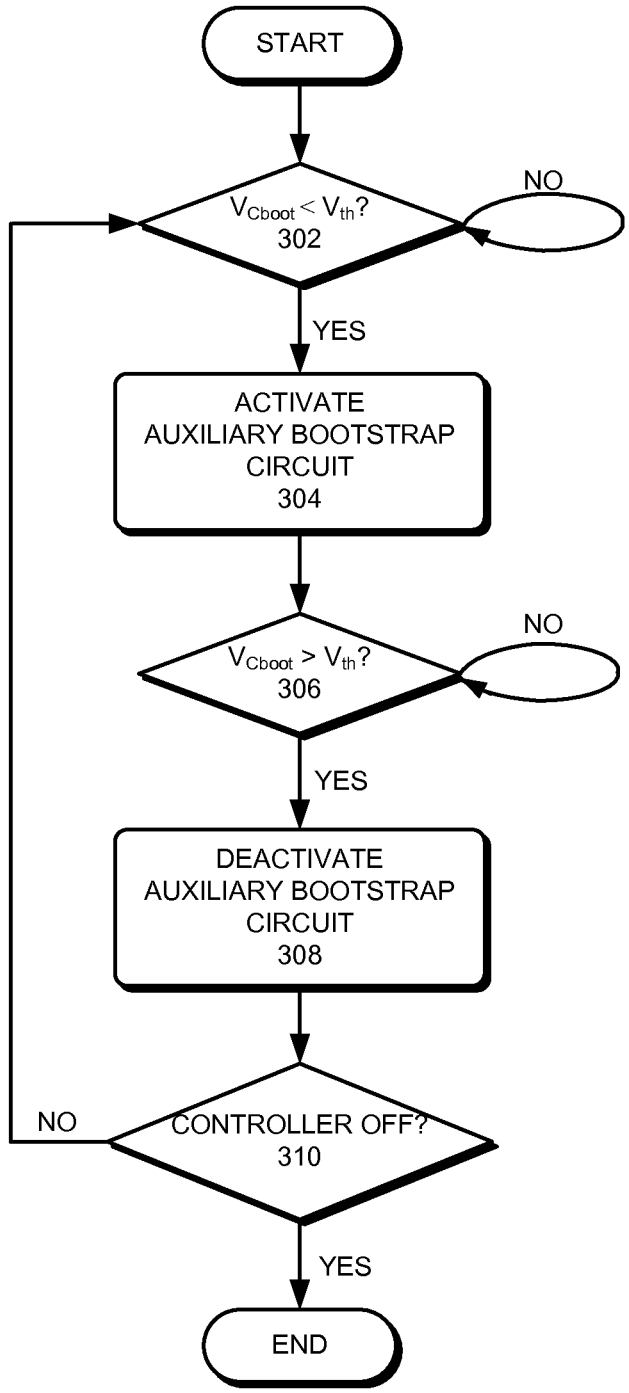
FIG. 3 presents a flowchart illustrating the process of refreshing a bootstrap capacitor within a synchronous switched-mode DC/DC converter in accordance with some embodiments herein.

FIG. 3 presents a flowchart illustrating the process of refreshing a bootstrap capacitor within a synchronous switched-mode DC/DC converter in accordance with some embodiments herein. Note that the process of FIG. 3 should be understood in the context of converter 200 in FIG. 2.

During operation, a controller of the converter (e.g., controller 250) first determines if the voltage across the bootstrap capacitor $Vc_{BOOT}$ is below a threshold voltage $V_{th}$ (step 302). Note that $V_{th}$ may be determined to be at least greater than $V_{gs\_th}$, i.e., the threshold voltage of Q1. If $Vc_{BOOT}$ is less than the threshold, the controller then activates the auxiliary bootstrap circuit (step 304). For example, the controller can activate the auxiliary bootstrap circuit by enabling the clock signal to the auxiliary bootstrap circuit. As a result, the auxiliary bootstrap circuit is used to refresh the bootstrap capacitor. If step 302 is determined to be otherwise, the controller returns to step 302 to continue monitoring the $Vc_{BOOT}$ value.

While the auxiliary bootstrap circuit is active as a result of step 304, the controller determines if the voltage across the bootstrap capacitor $Vc_{BOOT}$ is above the threshold voltage $V_{th}$ (step 306). If so, the controller deactivates the auxiliary bootstrap circuit (step 308). For example, the controller can deactivate the auxiliary bootstrap circuit by disabling the clock signal to the auxiliary bootstrap circuit. As a result, the regular bootstrap circuit of the converter is used to refresh the bootstrap capacitor. If step 306 is determined to be otherwise, the controller returns to step 306 to continue monitoring the $Vc_{BOOT}$ value while the auxiliary bootstrap circuit remains active.

While the regular bootstrap circuit is active and the auxiliary bootstrap circuit is disabled as a result of step 308, the controller subsequently determines if the converter is off (step 310). If not, the controller returns to step 302 to continue the refresh process. Otherwise, the refresh process is terminated.

Note that in the above-described controller-controlled process, the auxiliary bootstrap circuit is typically activated only when the controller is not under CCM mode of operation. In some embodiments, this controller-controlled process is triggered each time when the converter is powered on.

Figure 4:
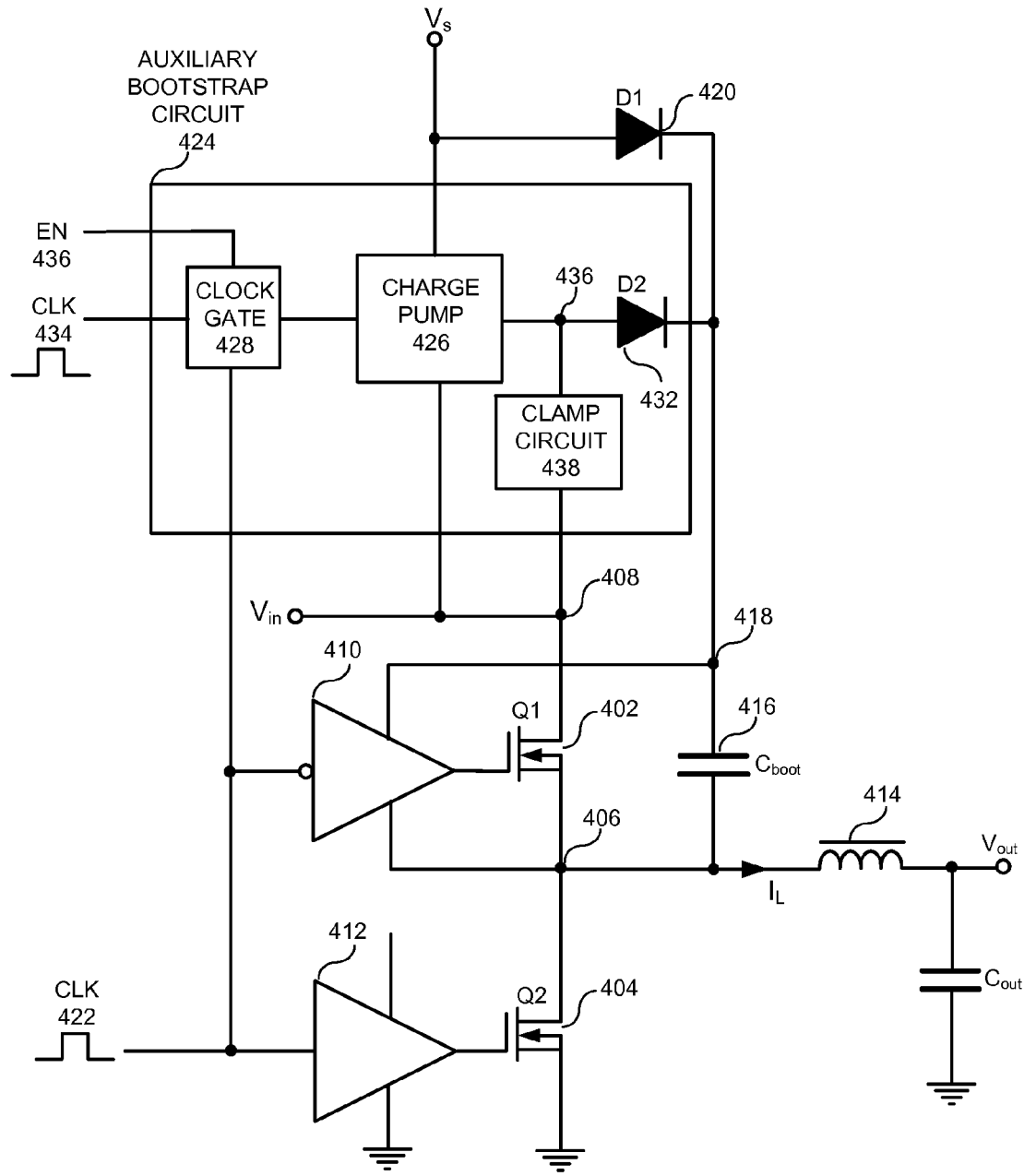
FIG. 4 illustrates a synchronous switched-mode DC/DC buck converter which includes another auxiliary bootstrap mechanism in accordance with some embodiments herein.

FIG. 4 illustrates a synchronous switched-mode DC/DC converter 400 which includes an auxiliary bootstrap mechanism in accordance with some embodiments herein. As is illustrated in FIG. 4, synchronous switched-mode DC/DC buck converter 400 ("converter 400" hereinafter) comprises all or substantially all components of converter 100. This includes a high-side N-type MOSFET 402 (also referred to as "Q1"), a low-side N-type MOSFET 404 (also referred to as "Q2"), driver circuits 410 and 412, a switching inductor 414, a bootstrap capacitor 416 (also referred to as "$C_{BOOT}$"), and diode 420 (also referred to as "D1"). During normal PWM switching, MOSFETs 402 and 404 are controlled a PWM clock signal 422 (or "clk 422"). Note that diode 420 and bootstrap capacitor 416 form the conventional bootstrap circuit for $C_{BOOT}$ refresh. Note also that nodes within converter 400 in FIG. 4 and equivalent nodes within converter 100 in FIG. 1 have like reference numerals. For example, switch node 406 in FIG. 4 is equivalent to switch node 106 in FIG. 1. Note that converter 400 receives an input voltage $V_{in}$ at the input node 408.

Converter 400 also includes an auxiliary bootstrap circuit 424, which further comprises a charge pump 426, a clock gate 428, a clamp circuit 438, and a diode 432 (also referred to as "D2"). In the embodiment shown, charge pump 426 receives both supply power Vs and input voltage $V_{in}$ as inputs, and a clock signal 434 (or "clk 434"). Clock gate 228 of auxiliary bootstrap circuit 224 receives a clock signal 434 (or "clk 434") as input. Clock gate 428 also receives an enable signal 436 (or "EN 436"), which is configured to selectively enable/disable clock gate 428, i.e., passing or blocking clock signal 434. Enable signal 236 may be generated by a controller circuit. Hence, auxiliary bootstrap circuit 424 is considered "enabled" when charge pump 426 receives clk 434.

Charge pump 426 is configured to generate an output voltage at node 436 which has a max value that is substantially equal to the sum of the two input voltages $Vs+V_{in}$ when no load is applied to charge pump 426. When the load applied, the output voltage at node 436 will be lower, depending on the internal impedance of this charge pump. Note that charge pump 426 may be implemented using any known charging pump circuit. Converter 400 additionally includes a clamp circuit 438 which is configured to prevent charge pump output voltage from rising above $Vs+V_{in}$. In one embodiment, clamp circuit 438 is implemented using a Zener diode having a breakdown voltage in the vicinity of Vs. Note that including clamp circuit 438 within auxiliary bootstrap circuit 424 alleviates the need to regulate the charge pump output voltage.

Consequently, auxiliary bootstrap circuit 424 can refresh bootstrap capacitor 416 through diode D2 as long as $V_{in}+Vs-V_{D2}>V_{PH}$, wherein $V_{D2}$ is the turn-on voltage of diode 432 and $V_{PH}$ is the voltage of switch node 406. Note that, depending on the operating mode, switch node 406 is generally between zero volts and input voltage $V_{in}$. Note also that the voltage across bootstrap capacitor 416 is generally between a high value $V_{in}+Vs-V_{D2}$ (when switch node 406 is LOW) and a low value $Vs-V_{D2}$ (when switch node 406 equals $V_{in}$). In one embodiment, supply voltage Vs is selected so that the low bootstrap capacitor voltage $Vs-V_{D2}>V_{gs\_th}$, where $V_{gs\_th}$ is the turn-on threshold voltage of Q1.

In one embodiment, instead of connecting clk 434 directly to charge pump 426, clk 434 is coupled to charge pump 426 through a clock gate (not shown) which is enabled/disabled by a enable signal. Hence, charge pump 426 receives clk 434 only when the clock gate is enabled. In one embodiment, this clock gate and hence clk 434 are disabled when converter 400 is under normal CCM mode switching, which allows bootstrap capacitor 416 to be refreshed through the normal refresh path Vs and D1. However, the clock gate and hence clk 434 are enabled in other operating conditions, thereby allowing bootstrap capacitor 416 to be refreshed by auxiliary bootstrap circuit 424.

Similarly to convert 200, clk 422 in converter 400 is coupled to clock gate 428, and can be optionally used as a synchronizing signal in place of enable signal 436 to turn on/off clock gate 428. More specifically, when clk 422 is HIGH, low-side MOSFET 404 is turned on which allows bootstrap capacitor 416 to refresh. Consequently, clk 422 can be used to disable clock gate 428, so that auxiliary bootstrap circuit 424 is deactivated. On the other hand, when clk 422 is LOW, low-side MOSFET 404 is turned off. Consequently, clk 422 can be used to enable clock gate 428, so that auxiliary bootstrap circuit 424 is activated.

In the above-described refresh process using auxiliary bootstrap circuit 424, refreshing bootstrap capacitor 416 does not need to switch high-side MOSFET 402 and low-side MOSFET 404 when high-side MOSFET 402 needs to be in an ON state while low-side MOSFET 204 is in an OFF state. This is particularly beneficial when converter 400 is used within a 4-switch buck-boost converter and converter 400 is not under PWM switching. Note also that the refresh process is substantially independent from the operating mode of converter 400. More specifically, the above-described refresh process can be carried out as long as auxiliary bootstrap circuit 424 is activated, regardless of whether converter 400 is under DCM switching, PFM switching, or not under regular PWM switching. Furthermore, using auxiliary bootstrap circuit 424 for refresh operation under light load conditions (such as DCM switching) prevents negative $I_L$ that is typically associated with conventional bootstrap capacitor refresh under the same conditions.

Figure 5:
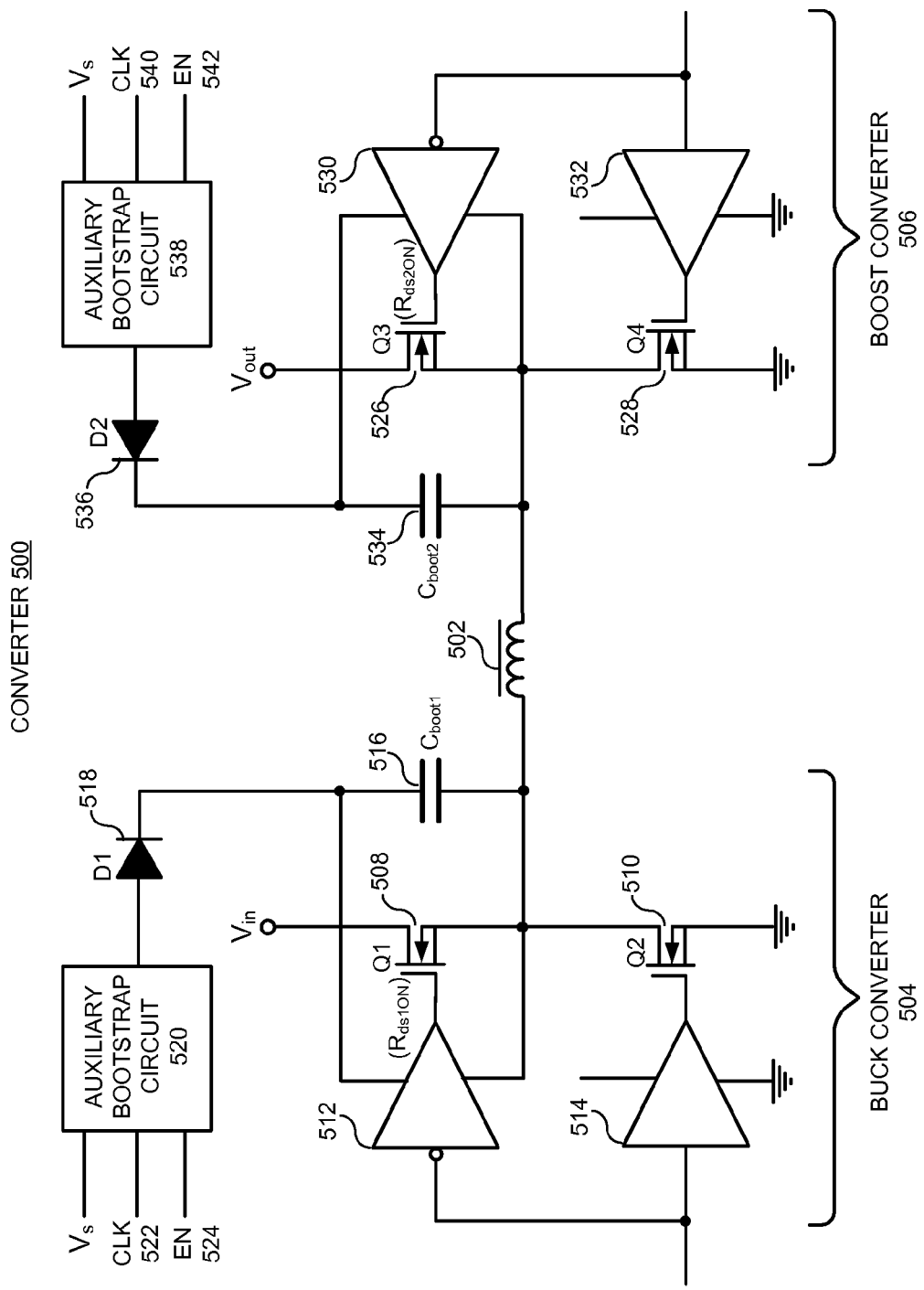
FIG. 5 illustrates a 4-switch buck-boost DC/DC converter which includes an auxiliary bootstrap mechanism on each side of the converter in accordance with some embodiments herein.

FIG. 5 illustrates a 4-switch buck-boost DC/DC converter 500 which includes an auxiliary bootstrap mechanism on each side of the converter in accordance with some embodiments herein. As is illustrated in FIG. 5, 4-switch buck-boost DC/DC converter 500 ("buck-boost converter 500" hereinafter) comprises a switching inductor 502, a two-switch buck converter 504 coupled to the left terminal of switching inductor 502, and a two-switch boost converter 506 coupled to the right terminal of switching inductor 502. Note that buck converter 504 and boost converter 506 are substantially symmetric with regard to switching inductor 502, and each of buck converter 504 and boost converter 506 is configured substantially identically to converter 200 in FIG. 2.

More specifically, buck converter 504 further comprises a high-side N-type MOSFET 508 (also referred to as "Q1"), a low-side N-type MOSFET 510 (also referred to as "Q2"), driver circuits 512 and 514, a bootstrap capacitor 516 (also referred to as "$C_{BOOT1}$"), and a diode 518 (also referred to as "D1"). Note that diode 518 and bootstrap capacitor 516 form the conventional bootstrap circuit for $C_{BOOT1}$ refresh. Buck converter 504 also includes an auxiliary bootstrap circuit 520, which is substantially identical in design to auxiliary bootstrap circuit 224 of converter 200 in FIG. 2. Note that auxiliary bootstrap circuit 520 may receive three inputs: supply voltage Vs, a clock signal 522 (or "clk 522"), and an enable signal 524 (or "EN 524"). The control and operation of auxiliary bootstrap circuit 520 is substantially identical to auxiliary bootstrap circuit 224 of converter 200 in FIG. 2, and therefore is not repeated herein.

Boost converter 506 further comprises a high-side N-type MOSFET 526 (also referred to as "Q3"), a low-side N-type MOSFET 528 (also referred to as "Q4"), driver circuits 530 and 532, a bootstrap capacitor 534 (also referred to as "$C_{BOOT2}$"), and a diode 536 (also referred to as "D2"). Note that diode 536 and bootstrap capacitor 534 form the conventional bootstrap circuit for $C_{BOOT2}$ refresh. Boost converter 506 also includes an auxiliary bootstrap circuit 538, which is substantially identical in design to auxiliary bootstrap circuit 224 of converter 200 in FIG. 2. Note that auxiliary bootstrap circuit 538 may also receive three inputs: supply voltage Vs, a clock signal 540 (or "clk 540"), and an enable signal 542 (or "EN 542"). The control and operation of auxiliary bootstrap circuit 538 is substantially identical to auxiliary bootstrap circuit 224 of converter 200 in FIG. 2, and therefore is not repeated herein. Note that while auxiliary bootstrap circuit 520 and auxiliary bootstrap circuit 538 may be identical to each other, the control and operation of these two circuits can be substantially independent of each other.

In particular, when buck-boost converter 500 is under boost mode of operation, boost converter 506 is under PWM switching while buck converter 504 is not under PWM switching. Instead, Q1 is ON which can be modeled as a resistive element $R_{ds1ON}$, while Q2 is OFF which can be regarded as an open circuit. Furthermore, buck-boost converter 500 receives an input voltage $V_{in}$ which is coupled to the gate of Q1 and generates an output voltage $V_{out}$ at the gate of Q3. In this case, auxiliary bootstrap circuit 520 is activated for $C_{BOOT1}$ refresh. Meanwhile, auxiliary bootstrap circuit 538 is activated for $C_{BOOT2}$ refresh unless boost converter 506 is under CCM switching.

On the other hand, when 4-switch buck-boost converter 500 is under buck mode of operation, buck converter 504 is under PWM switching while boost converter 506 is not under PWM switching. Instead, Q3 is ON which can be modeled as a resistive element $R_{ds2ON}$, while Q4 is OFF which can be regarded as an open circuit. Furthermore, buck-boost converter 500 receives an input voltage $V_{in}$ which is coupled to the gate of Q3 and generates an output voltage $V_{out}$ at the gate of Q1. In this case, auxiliary bootstrap circuit 538 is activated for $C_{BOOT2}$ refresh. Meanwhile, auxiliary bootstrap circuit 520 is activated for $C_{BOOT1}$ refresh unless buck converter 504 is under CCM switching.

Figure 6:
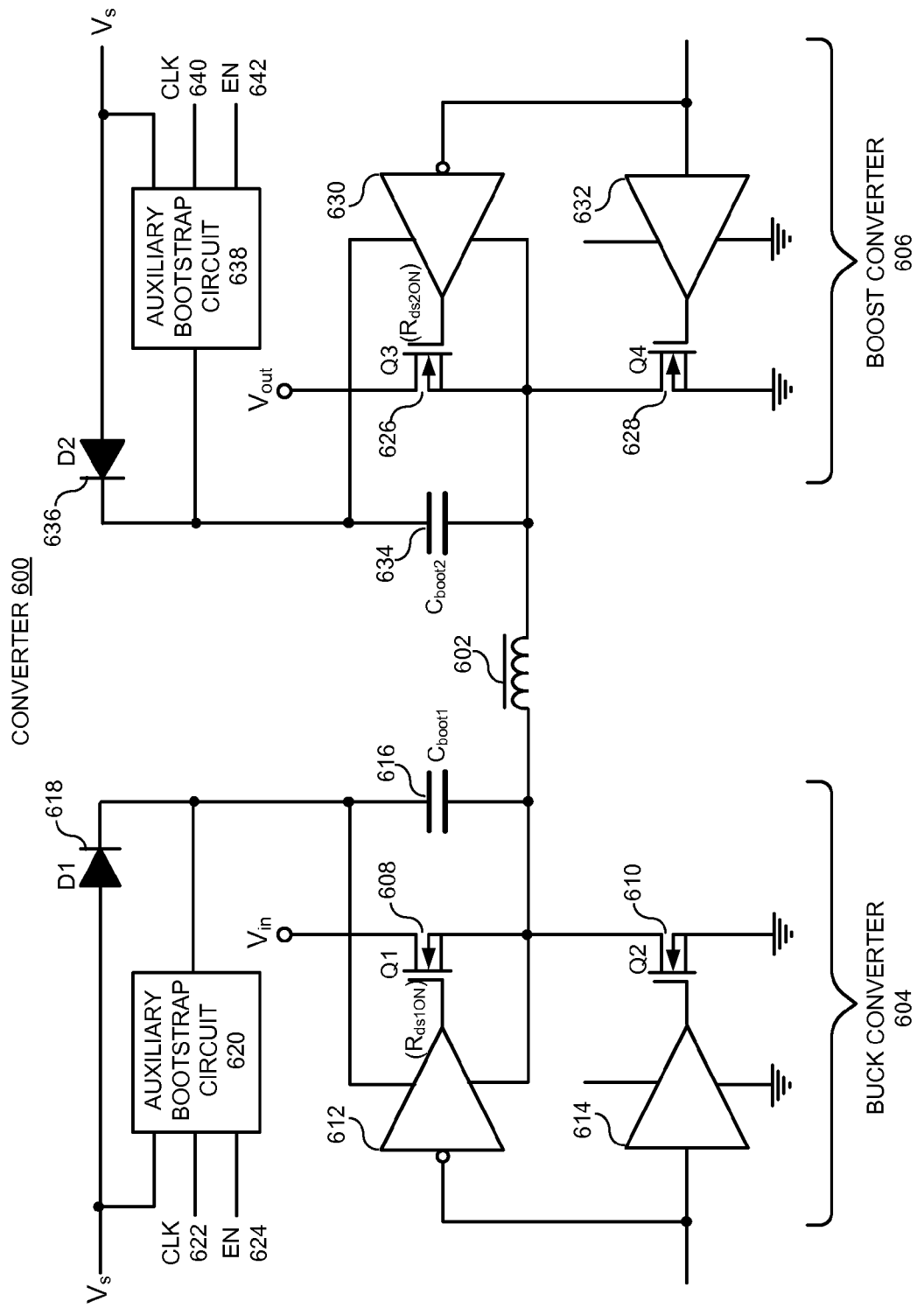
FIG. 6 illustrates a 4-switch buck-boost DC/DC converter which includes another auxiliary bootstrap mechanism on each side of the converter in accordance with some embodiments herein.

FIG. 6 illustrates a 4-switch buck-boost DC/DC converter 600 which includes another auxiliary bootstrap mechanism on each side of the converter in accordance with some embodiments herein. As is illustrated in FIG. 6, 4-switch buck-boost DC/DC converter 600 ("buck-boost converter 600" hereinafter) is substantially identical to buck-boost converter 500 except for the respective auxiliary bootstrap circuit design.

More specifically, buck converter 604 comprises a high-side N-type MOSFET 608 (also referred to as "Q1"), a low-side N-type MOSFET 610 (also referred to as "Q2"), driver circuits 612 and 614, a bootstrap capacitor 616 (also referred to as "$C_{BOOT1}$"), and a diode 618 (also referred to as "D1"). Buck converter 604 also includes an auxiliary bootstrap circuit 620, which is substantially identical in design to auxiliary bootstrap circuit 424 of converter 400 in FIG. 4. Note that auxiliary bootstrap circuit 620 may receive three inputs: supply voltage Vs, a clock signal 622 (or "clk 622"), and an enable signal 624 (or "EN 624"). Different from buck converter 504, the output of auxiliary bootstrap circuit 620 is coupled to the cathode of diode 618. Note that the control and operation of auxiliary bootstrap circuit 620 is substantially identical to auxiliary bootstrap circuit 424 of converter 400 in FIG. 4, and therefore is not repeated herein.

Similarly, boost converter 606 comprises a high-side N-type MOSFET 626 (also referred to as "Q3"), a low-side N-type MOSFET 628 (also referred to as "Q4"), driver circuits 630 and 632, a bootstrap capacitor 634 (also referred to as "$C_{BOOT2}$"), and a diode 636 (also referred to as "D2"). Boost converter 606 also includes an auxiliary bootstrap circuit 638, which is substantially identical in design to auxiliary bootstrap circuit 424 of converter 400 in FIG. 4. Note that auxiliary bootstrap circuit 638 may receive three inputs: supply voltage Vs, a clock signal 640 (or "clk 640"), and an enable signal 642 (or "EN 642"). Different from boost converter 506, the output of auxiliary bootstrap circuit 638 is coupled to the cathode of diode 636. Note that the control and operation of auxiliary bootstrap circuit 638 is substantially identical to auxiliary bootstrap circuit 424 of converter 400 in FIG. 4, and therefore is not repeated herein.

In particular, when buck-boost converter 600 is under boost mode of operation, boost converter 606 is under PWM switching while buck converter 604 is not under PWM switching. Instead, Q1 is ON which can be modeled as a resistive element $R_{ds1ON}$, while Q2 is OFF which can be regarded as an open circuit. Furthermore, buck-boost converter 600 receives an input voltage $V_{in}$ which is coupled to the gate of Q1 and generates an output voltage $V_{out}$ at the gate of Q3. In this case, auxiliary bootstrap circuit 620 is activated for $C_{BOOT1}$ refresh. Meanwhile, auxiliary bootstrap circuit 638 is activated for $C_{BOOT2}$ refresh unless boost converter 606 is under CCM switching.

On the other hand, when buck-boost converter 600 is under buck mode of operation, buck converter 604 is under PWM switching while boost converter 606 is not under PWM switching. Instead, Q3 is ON which can be modeled as a resistive element $R_{ds2ON}$, while Q4 is OFF which can be regarded as an open circuit. Furthermore, buck-boost converter 600 receives an input voltage $V_{in}$ which is coupled to the gate of Q3 and generates an output voltage $V_{out}$ at the gate of Q1. In this case, auxiliary bootstrap circuit 638 is activated for $C_{BOOT2}$ refresh. Meanwhile, auxiliary bootstrap circuit 620 is activated for $C_{BOOT1}$ refresh unless buck converter 604 is under CCM switching.

Note that while the described embodiments of FIG. 5 and FIG. 6 use the same type of auxiliary bootstrap circuit in both the buck converter and the boost converter of a buck-boost converter, other embodiments of a buck-boost converter can use a combination of auxiliary bootstrap circuit 224 and auxiliary bootstrap circuit 424. In some embodiments, a 4-switch buck-boost converter can use either auxiliary bootstrap circuit 224 or auxiliary bootstrap circuit 424 in only one side of the 4-switch buck-boost converter. Although the techniques of FIG. 5 and FIG. 6 are described in terms of 4-switch buck-boost converters, these techniques can also be applied to 2-switch buck-boost converter or any other DC-DC converter configurations, and therefore are not limited to the 4-switch buck-boost converters. Note also that each of the converter designs described in conjunction with FIGS. 1-6 can be used as a charging circuit for charging batteries.

The preceding description was presented to enable any person skilled in the art to make and use the disclosed embodiments, and is provided in the context of a particular application and its requirements. Various modifications to the disclosed embodiments will be readily apparent to those skilled in the art, and the general principles defined herein may be applied to other embodiments and applications without departing from the spirit and scope of the disclosed embodiments. Thus, the disclosed embodiments are not limited to the embodiments shown, but are to be accorded the widest scope consistent with the principles and features disclosed herein. Accordingly, many modifications and variations will be apparent to practitioners skilled in the art. Additionally, the above disclosure is not intended to limit the present description. The scope of the present description is defined by the appended claims.

Also, some of the above-described methods and processes can be embodied as code and/or data, which can be stored in a computer-readable storage medium as described above. When a computer system reads and executes the code and/or data stored on the computer-readable storage medium, the computer system performs the methods and processes embodied as data structures and code and stored within the computer-readable storage medium. Furthermore, the methods and apparatus described can be included in, but are not limited to, application-specific integrated circuit (ASIC) chips, field-programmable gate arrays (FPGAs), and other programmable-logic devices.

What is claimed is:

1. A synchronous switching converter for converting a DC input voltage into a DC output voltage, comprising:
   a high-side switching MOSFET coupled between an input node and a first node;
   a low-side switching MOSFET coupled between the first node and a ground node and in series with the high-side switching MOSFET;
   an inductor coupled to the first node;
   a bootstrap capacitor coupled to the high-side switching MOSFET to provide turn-on voltage for the high-side switching MOSFET;
   a main refresh circuit coupled to the bootstrap capacitor and configured to refresh the bootstrap capacitor during a first operating mode of the synchronous switching converter; and
   an auxiliary refresh circuit coupled to the main refresh circuit and the bootstrap capacitor, the auxiliary refresh circuit comprising a charge pump circuit and a gate circuit configured to convey an activate signal to the charge pump when enabled by an enable signal,
   wherein the auxiliary refresh circuit is configured to receive the enable signal at the gate circuit, the enable signal is switchably selected to be one of (i) a control signal generated by a controller and (ii) a clock signal which drives the high-side switching MOSFET and the low side switching MOSFET, and
   wherein the charge pump circuit is configured, when activated by the activate signal, to refresh the bootstrap capacitor during a second operating mode of the synchronous switching converter.

2. The synchronous switching converter of claim 1, wherein the synchronous switching converter is either a buck converter or a boost converter.

3. The synchronous switching converter of claim 1, wherein the synchronous switching converter is a buck-boost converter that further comprises a second auxiliary refresh circuit that comprises a second charge pump circuit to refresh a second bootstrap capacitor.

4. The synchronous switching converter of claim 1, wherein the charge pump circuit is further configured to receive the activate signal as an input and generate, based at least in part on the activate signal, a sufficiently high output voltage for refreshing the bootstrap capacitor, and wherein the sufficiently high output voltage is based at least in part on a supply voltage supplied to the auxiliary refresh circuit and an input voltage supplied to the input node.

5. The synchronous switching converter of claim 1, wherein the auxiliary refresh circuit is configured to receive a disable signal that deactivates the charge pump circuit from refreshing the bootstrap capacitor during the first operating mode of the synchronous switching converter.

6. The synchronous switching converter of claim 5, wherein the controller circuit configured to cause the disable signal and the enable signal to be generated during the first operating mode and the second operating mode.

7. The synchronous switching converter of claim 1, wherein the first operating mode is a continuous current mode (CCM) during a pulse-width modulation (PWM) switching operation.

8. The synchronous switching converter of claim 1, wherein the second operating mode is at least one of the following: a discontinuous current mode (DCM) during a PWM switching operation, a pulse-frequency modulation (PFM) operation, and when the high-side switching MOSFET is ON and the low-side switching MOSFET is OFF.

9. The synchronous switching converter of claim 1, wherein the auxiliary refresh circuit further comprises at least one diode coupled between a supply voltage and the gate of the high-side switching MOSFET, and wherein the supply voltage is set at a voltage level based at least in part on the turn-on voltage of the at least one diode and a threshold voltage of the high-side switching MOSFET.

10. A charging circuit, comprising:
    a DC power connector; and
    a synchronous switching converter coupled to the DC power connector and configured to convert a DC input voltage to a DC output voltage;

wherein the synchronous switching converter further comprises:
a high-side switching MOSFET coupled between an input node and a first node;
a low-side switching MOSFET coupled between the first node and a ground node and in series with the high-side switching MOSFET;
an inductor coupled to the first node;
a bootstrap capacitor coupled to the high-side switching MOSFET to provide turn-on voltage for the high-side switching MOSFET;
a main refresh circuit coupled to the bootstrap capacitor and configured to refresh the bootstrap capacitor during a first operating mode of the synchronous switching converter; and
an auxiliary refresh circuit that comprises a charge pump circuit and a gate circuit configured to convey an activate signal to the charge pump when enabled by an enable signal, wherein the auxiliary refresh circuit is coupled to the main refresh circuit and to the bootstrap capacitor,
wherein the auxiliary refresh circuit is adapted to:
receive, during a second operating mode of the synchronous switching converter, the enable signal at the gate circuit, the enable signal is switchably selected to be one of (i) a control signal generated by a controller and (ii) a clock signal which drives the high-side switching MOSFET and the low side switching MOSFET; and
activate the charge pump circuit to refresh the bootstrap capacitor based at least in part on the activate signal received via the gate circuit during the second operating mode of the synchronous switching converter.

11. The charging circuit of claim 10, wherein the synchronous switching converter is either a buck converter or a boost converter.

12. The charging circuit of claim 10, wherein the synchronous switching converter is a buck-boost converter that further comprises a second auxiliary refresh circuit that comprises a second charge pump circuit to refresh a second bootstrap capacitor.

13. The charging circuit of claim 10, wherein the charge pump circuit is configured to receive the enable signal as an input and generate, based at least in part on the enable signal, a sufficiently high output voltage for refreshing the bootstrap capacitor, and wherein the sufficiently high output voltage is based at least in part on a supply voltage supplied to the auxiliary refresh circuit and the DC input voltage supplied to the input node.

14. The charging circuit of claim 10, wherein the auxiliary refresh circuit is configured to receive a second control signal that deactivates the charge pump circuit from refreshing the bootstrap capacitor during the first operating mode of the synchronous switching converter.

15. The charging circuit of claim 14, wherein the controller circuit configured to generate the control signal and the second control signal during the first operating mode and the second operating mode.

16. The charging circuit of claim 10, wherein the first operating mode is a continuous current mode (CCM) during a pulse-width modulation (PWM) switching operation.

17. The charging circuit of claim 10, wherein the second operating mode is at least one of the following: a discontinuous current mode (DCM) during a PWM switching operation, a pulse-frequency modulation (PFM) operation, and when the high-side switching MOSFET is ON and the low-side switching MOSFET is OFF.

18. The charging circuit of claim 10, wherein the auxiliary refresh circuit further comprises a diode coupled between a supply voltage and the gate of the high-side switching MOSFET, and wherein the supply voltage is set at a voltage level based at least in part on the turn-on voltage of the at least one diode and the threshold voltage of the high-side switching MOSFET.

19. An IC circuit that converts a DC input voltage into a DC output voltage, comprising:
a high-side switching MOSFET coupled between an input node and a first node;
a low-side switching MOSFET coupled between the first node and a ground node and in series with the high-side switching MOSFET;
an inductor coupled to the first node;
a bootstrap capacitor coupled to the high-side switching MOSFET to provide turn-on voltage for the high-side switching MOSFET;
a main refresh circuit coupled to the bootstrap capacitor and configured to refresh the bootstrap capacitor during a first operating mode of a synchronous switching converter; and
an auxiliary refresh circuit coupled to the main refresh circuit and the bootstrap capacitor, the auxiliary refresh circuit comprising a charge pump circuit and a gate circuit configured to convey an activate signal to the charge pump when enabled by an enable signal,
wherein the auxiliary refresh circuit is configured to receive the enable signal at the gate circuit, to the enable signal is switchably selected to be one of (i) a control signal generated by a controller and (ii) a clock signal which drives at least one of the high-side switching MOSFET and the low-side switching MOSFET, and
wherein the charge pump circuit is configured, when activated by the activate signal, to refresh the bootstrap capacitor during a second operating mode of the synchronous switching converter.

20. The synchronous switching converter of claim 1, wherein the auxiliary refresh circuit receives the enable signal that activates the charge pump circuit when the bootstrap capacitor falls below a threshold value during the second operation mode of the synchronous switching converter.

21. The synchronous switching converter of claim 1, wherein the charge pump circuit comprises a driver circuit that is coupled in series to an auxiliary bootstrap capacitor, and wherein the auxiliary bootstrap capacitor has a relatively smaller capacitance than the bootstrap capacitor.

22. The synchronous switching converter of claim 1, wherein the charge pump circuit is coupled to the first node such that the charge pump circuit is configured to receive an input supply voltage that charges the bootstrap capacitor and an input voltage that is also supplied at the first node.

23. The synchronous switching converter of claim 1, wherein the auxiliary refresh circuit further comprises a clamp circuit and a diode, and wherein one end of the clamp circuit is connected between the charge pump circuit and the diode.

24. The synchronous switching converter of claim 1, wherein the auxiliary refresh circuit is further configured to refresh the bootstrap capacitor in the second operating mode without producing negative inductor current from the inductor.

25. The charging circuit of claim 10, wherein the charge pump circuit comprises a driver circuit that is coupled in series to an auxiliary bootstrap capacitor, and wherein the auxiliary bootstrap capacitor has a relatively smaller capacitance than the bootstrap capacitor.

26. The charging circuit of claim 10, wherein the charge pump circuit is coupled to the first node such that the charge pump circuit is configured to receive a supply voltage that charges the bootstrap capacitor and the DC input voltage.

27. The charging circuit of claim 10, wherein the auxiliary refresh circuit further comprises a clamp circuit and a diode, and wherein one end of the clamp circuit is connected between the charge pump circuit and the diode.

28. The charging circuit of claim 10, wherein the auxiliary refresh circuit receives the control signal that activates the charge pump circuit when the bootstrap capacitor falls below a threshold value during the second operation mode of the synchronous switching converter.

29. The charging circuit of claim 10, wherein the auxiliary refresh circuit is further configured to refresh the bootstrap capacitor that prevents negative inductor current from the inductor during the second operating mode.

30. The IC circuit of claim 19, wherein the auxiliary refresh circuit is further configured to refresh the bootstrap capacitor in the second operating mode without producing negative inductor current from the inductor.

31. The IC circuit of claim 19, wherein the synchronous switching converter is a buck-boost converter that further comprises a second auxiliary refresh circuit that comprises a second charge pump circuit to refresh a second bootstrap capacitor.

* * * * *